United States Patent
Griffin et al.

(10) Patent No.: US 10,196,741 B2
(45) Date of Patent: Feb. 5, 2019

(54) WAFER PLACEMENT AND GAP CONTROL OPTIMIZATION THROUGH IN SITU FEEDBACK

(71) Applicant: Applied Materials, Inc., Santa Clara, CA (US)

(72) Inventors: Kevin Griffin, Livermore, CA (US); Abraham Ravid, San Jose, CA (US); Alex Minkovich, Campbell, CA (US); Somesh Khandelwal, Sunnyvale, CA (US); Joseph Yudovsky, Campbell, CA (US); Todd Egan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1166 days.

(21) Appl. No.: 14/471,884

(22) Filed: Aug. 28, 2014

(65) Prior Publication Data

US 2015/0376782 A1    Dec. 31, 2015

Related U.S. Application Data

(60) Provisional application No. 62/018,224, filed on Jun. 27, 2014.

(51) Int. Cl.
| | |
|---|---|
| *B05C 1/08* | (2006.01) |
| *B05C 11/10* | (2006.01) |
| *C23C 16/458* | (2006.01) |
| *C23C 16/455* | (2006.01) |
| *C23C 16/52* | (2006.01) |
| *G01D 5/24* | (2006.01) |

(52) U.S. Cl.
CPC .... *C23C 16/4584* (2013.01); *C23C 16/45544* (2013.01); *C23C 16/52* (2013.01); *G01D 5/24* (2013.01)

(58) Field of Classification Search
CPC ............... C23C 16/4584; C23C 16/52; C23C 16/45544; G01D 5/24; B05C 1/0886; B05C 1/0891; B05C 11/1021; G05B 2219/37002
USPC ........... 118/668; 156/345.13, 345.15, 345.24
See application file for complete search history.

(56) References Cited

U.S. PATENT DOCUMENTS

| | | | |
|---|---|---|---|
| 3,539,759 A | 11/1970 | Spiro et al. | |
| 4,897,171 A | 1/1990 | Ohmi | |
| 5,520,501 A | 5/1996 | Kouno et al. | |
| 6,197,117 B1 | 3/2001 | Li et al. | |
| 6,821,910 B2 * | 11/2004 | Adomaitis | C23C 16/4412 |
| | | | 118/715 |
| 6,823,753 B1 | 11/2004 | Beginski | |
| 6,950,774 B2 | 9/2005 | Donald | |
| 8,357,549 B2 | 1/2013 | Brenninger et al. | |
| 8,441,617 B2 | 5/2013 | Hoogendam et al. | |
| 2004/0083966 A1 * | 5/2004 | Takahashi | G03F 7/70833 |
| | | | 118/715 |
| 2004/0143412 A1 * | 7/2004 | Donald | G01C 9/00 |
| | | | 702/150 |
| 2008/0246493 A1 * | 10/2008 | Gardner | C23C 16/45565 |
| | | | 324/662 |

(Continued)

FOREIGN PATENT DOCUMENTS

EP    2103720    3/2012

*Primary Examiner* — Rudy Zervigon
(74) *Attorney, Agent, or Firm* — Servilla Whitney LLC

(57) ABSTRACT

Apparatus and methods of dimension control and monitoring between a processes fixture and a susceptor, and position determination of wafers are described.

17 Claims, 8 Drawing Sheets

(56) References Cited

U.S. PATENT DOCUMENTS

| | | | |
|---|---|---|---|
| 2009/0081886 A1* | 3/2009 | Levy | C23C 16/45551 |
| | | | 438/790 |
| 2012/0085278 A1 | 4/2012 | Moslehi et al. | |
| 2012/0225191 A1 | 9/2012 | Yudovsky et al. | |
| 2013/0196078 A1 | 8/2013 | Yudovsky et al. | |
| 2013/0210238 A1 | 8/2013 | Yudovsky | |
| 2016/0027675 A1* | 1/2016 | Ravid | H01L 21/67259 |
| | | | 118/713 |

* cited by examiner

WAFER PLACEMENT AND GAP CONTROL OPTIMIZATION THROUGH IN SITU FEEDBACK

TECHNICAL FIELD

Principles and embodiments of the present invention generally relate to apparatus and methods of positioning and detecting wafers in a substrate support or carousel.

BACKGROUND

New generations of processing tools require tighter control of the gap between a wafer and a deposition source to meet composition and thickness uniformity across a wafer and between different wafers. Furthermore, processes may be conducted at various temperatures, and with a range of separations between the wafer surface and deposition source. Monitoring the uniformity of the separation distance for these processes can be important to ensure proper deposition thicknesses and quality.

Cameras have been used to ensure the uniformity of distance between the substrate support and processing fixtures, where the camera may be used to monitor a fixed section of the processing chamber and detect changes in the gap between the support and fixture or the presence of an object projecting above the level of the support when the object is in the camera's field of view.

Cameras, however, take up space either internally within the processing chamber or externally around the periphery of the chamber. Cameras are also limited to the temperatures they can be exposed to, so it may not be technically feasible to have cameras located within a chamber for higher temperature processes. For example, a camera and other optical detectors will overheat and cannot be used to track the movement of a wafer or its recess directly at process temperatures above about 80° C.

Cameras are also typically arranged around the outside edge of a wafer support, so cannot easily monitor an inside edge of the support.

Limited space in the chamber for viewing ports and optics limits options for remote imaging. High temperatures, plasma glow and interference from process-critical hardware limit options for remote optical measurement and optimization of wafer placement in the chamber.

SUMMARY

An aspect of the present invention relates generally to an apparatus comprising a processing fixture comprising a processing fixture body having a processing fixture bottom surface, one or more openings in the fixture body, and one or more proximity sensor(s) retained within the one or more openings; and a susceptor comprising a susceptor plate having a susceptor plate top surface, a susceptor center point, and one or more recesses formed in the susceptor plate top surface a distance RR from the susceptor center point; where the susceptor plate top surface and the processing fixture bottom surface are substantially parallel, and the susceptor plate top surface is separated from the processing fixture bottom surface by a gap distance DG; and the one or more openings and proximity sensor(s) are substantially orthogonal to the susceptor plate top surface, and at least one opening and proximity sensor is located a radial distance RR from the susceptor center point.

An aspect of the present invention relates generally to an apparatus comprising a processing fixture comprising a processing fixture body having a processing fixture top surface, a processing fixture bottom surface opposite the processing fixture top surface, a thickness between the processing fixture top surface and the processing fixture bottom surface, and three or more openings in the processing fixture bottom surface; a susceptor comprising a susceptor plate having a susceptor plate top surface, a susceptor plate bottom surface opposite the susceptor plate top surface, a thickness between the susceptor plate top surface and the susceptor plate bottom surface, and one or more recesses in the susceptor plate top surface, wherein the susceptor plate top surface and the processing fixture bottom surface are substantially parallel, and the susceptor plate top surface is separated from the processing fixture bottom surface by a gap distance $D_G$; a support post affixed to the susceptor plate that defines an axis of rotation of the susceptor, wherein the one or more recesses in the susceptor plate top surface are a distance $R_R$ from the axis of rotation; three or more capacitive displacement sensors that measures the gap distance, wherein each of the three or more capacitive displacement sensors are retained within one of the three or more openings in the processing fixture bottom surface, and each of the three or more capacitive displacement sensors have an operative face substantially parallel to the susceptor plate top surface; and wherein a first of the three or more proximity sensors is located a distance $R_1$ from the axis of rotation, a second of the three or more proximity sensors is located a distance $R_2$ from the axis of rotation, and a third of the three or more proximity sensors is located a distance $R_3$ from the axis of rotation, wherein $R_2 = R_R$ and $R_1 > R_2 > R_3$.

An aspect of the present invention relates generally to a method comprising rotating a susceptor around an axis of rotation, the susceptor comprising a top surface and one or more recesses; measuring a gap distance between an operative face of a proximity sensor and the top surface of the susceptor at one or more radial distances from the axis of rotation; detecting changes in the gap distance as the susceptor rotates around the axis of rotation; and determining the position of one or more surface features from the gap distances measured at one or more radial distances from the axis of rotation.

BRIEF DESCRIPTION OF THE DRAWINGS

Further features of embodiment of the present invention, their nature and various advantages will become more apparent upon consideration of the following detailed description, taken in conjunction with the accompanying drawings, which are also illustrative of the best mode contemplated by the applicants, and in which like reference characters refer to like parts throughout, where.

DETAILED DESCRIPTION

Figure 1A:
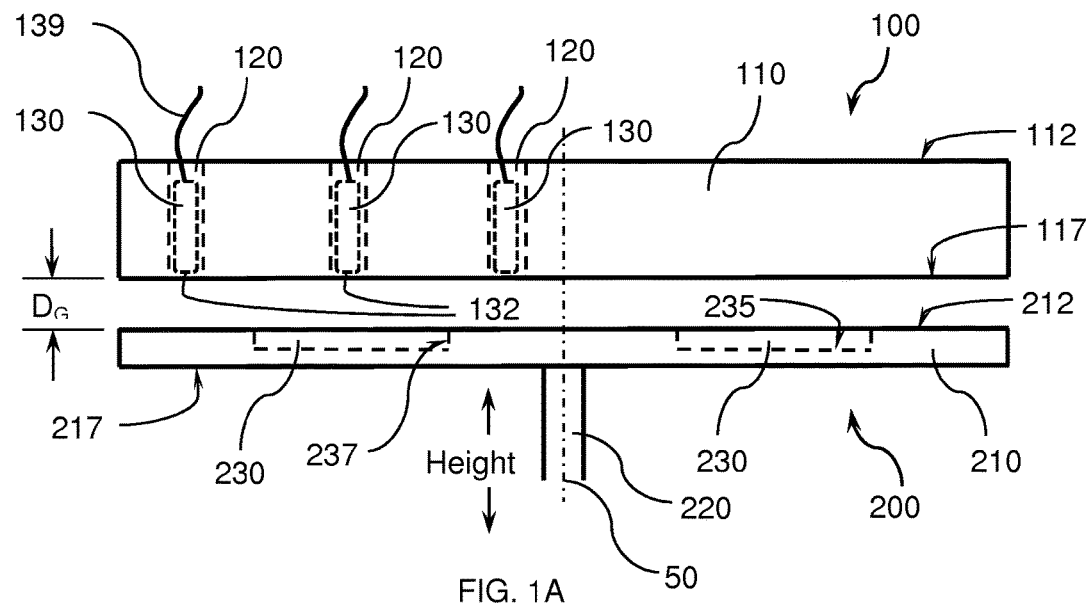
FIG. 1A illustrates a side view of an exemplary embodiment of a process fixture and a susceptor.

Before describing several exemplary embodiments of the invention, it is to be understood that the invention is not limited to the details of construction or process steps set forth in the following description. The invention is capable of other embodiments and of being practiced or being carried out in various ways.

Reference throughout this specification to "one embodiment," "certain embodiments," "various embodiments," "one or more embodiments," "in some embodiments," or "an embodiment" means that a particular feature, structure, material, or characteristic described in connection with the embodiment may be included in at least one embodiment of the invention. Furthermore, the appearances of the phrases such as "in one or more embodiments," "in certain embodiments," "in some embodiments," "in one embodiment" or "in an embodiment" in various places throughout this specification are not necessarily referring to the same embodiment of the invention. In addition, the particular features, structures, materials, or characteristics described may be combined in any suitable manner in one or more embodiments.

A "substrate surface" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the embodiments of the present invention any of the film processing steps disclosed may also be performed on an underlayer formed on the substrate as disclosed in more detail below, and the term "substrate surface" is intended to include such underlayer as the context indicates.

Principles and embodiments of the present invention relate to apparatus and processes which involve vertical dimension control between a wafer and a processes fixture in a process chamber.

Various embodiments relate to a deposition apparatus comprising a processing fixture and a susceptor, where the processing fixture comprises one or more proximity sensors affixed to the processing fixture that can measure the distance between the processing fixture and the susceptor.

In various embodiments, the processing fixture may be a gas distribution showerhead, an atomic layer deposition (ALD) injector, or a chemical vapor deposition (CVD) apparatus.

Process fixtures can be precisely engineered to achieve and maintain a particular mechanical gap, but this gap distance can change with temperature and in cases where processes fixtures separate (e.g., components move relative to each other) when the process chamber is opened for service.

Embodiments of the present invention also relate to proximity sensors located at different positions to detect the angle and/or position of a wafer in a susceptor recess for processes which involve precise placement of a wafer into a moving process fixture.

In various embodiments, a plurality of proximity sensors are installed substantially vertically in a processing fixture above a susceptor and directed towards the surface of the susceptor closest to and facing the processing fixture. In some embodiments, the plurality of proximity sensors measures a distance between the sensor and a surface directly below the proximity sensor. As used in this specification and the appended claims, the term "substantially vertically" means that the longitudinal axis of an object such as a proximity sensor forms an angle with the normal to a reference surface of less than 5°, or less than 2°, or less than 1.5°, or less than 1°, or less than 0.5°, or less than 0.2°, or about 0.0°.

In various embodiments, the processing fixture body comprises at least three openings, and a proximity sensor may be retained within each opening.

In various embodiments, the processing fixture comprises four openings and proximity sensors.

In some embodiments, the proximity sensor(s) may be installed in opening(s) formed in the processing fixture that are configured and dimensioned to retain the proximity sensor(s). In some embodiments, the opening may be threaded and the proximity sensor may be screwed into the opening. The opening may be dimensioned to retain the proximity sensor with a push or press fit. The proximity sensor may be retained in the opening using a glue or adhesive. The proximity sensor may be soldered into the opening. The proximity sensor may be retained by a combination of any of a push fit, a press fit, adhesive or glue, soldering and physical cooperative interaction (e.g., complementary screw threads).

In various embodiments, the proximity sensor may be selected from the group consisting of a capacitive displacement sensor and an inductive displacement sensor, where the measured electrical signal (e.g., capacitance or inductance) is approximately proportional to the distance between the face of the sensor and the face of the opposing surface. The electrical signal is indicative of the gap between the susceptor surface and the sensor. A capacitive displacement sensor may measure the position of objects down to the nanometer level. An inductive displacement sensor may be more resilient to dirty environments.

In various embodiments, the variation in measurements from one or more of the capacitive displacement sensors allows determination of the parallelism of the susceptor to the processing fixture. The changes in distance between the capacitive displacement sensor and the susceptor surface as the susceptor rotates may indicate a wobble if the surface is not parallel to the processing fixture, perpendicular to the axis of rotation, and/or thickness variation in the susceptor.

The one or more recess(es) in the susceptor may be configured and dimensioned to receive a wafer, where wafer(s) may have different diameters (e.g., 76 mm, 100 mm, 200 mm, 300 mm, 450 mm etc.) and different thicknesses (e.g., 160 µm, 200 µm, 275 µm, 375 µm, 525 µm, 625 µm, 725 µm, 775 µm, 925, etc.) In some embodiments, the depth of the recess into the susceptor surface may be equal to or slightly greater than the thickness of the wafer intended to be inserted into the recess, so the top wafer surface is flush with or slightly below the top surface of the susceptor.

In various embodiments, a plurality of proximity sensors may be arranged in a line extending radially from the center point of the processing fixture (e.g., injector, showerhead) and/or susceptor, where the rotational axis of the susceptor is located at the susceptor center point and aligned with the center point of the injector. In some embodiments, the projection of the axis of rotation forms a centerline for both the processing fixture and susceptor.

In various embodiments, three proximity sensors are located in vertical openings in an injector arranged in a straight line extending radially from the centerline of the processing fixture and susceptor. The first proximity sensor and opening may be positioned at a radial distance $R_1$ from the center point, so that the sensor is above an outer section of the susceptor beyond the recesses. The second proximity sensor and opening may be positioned at a radial distance $R_2$ from the centerline, so that the sensor may be positioned above a recess in the susceptor. The third proximity sensor and opening may be positioned at a radial distance $R_3$ from the centerline, so that the sensor is positioned above an inner section of the susceptor closer to the axis of rotation than the inside edge of the recesses.

In various embodiments, three proximity sensors are located in vertical openings that are not in a straight line extending radially from the center point of the injector, rather arranged in a triangular pattern. In embodiments of the sort, the first proximity sensors may be positioned at a radial distance $R_1$ from the centerline, so that the sensor is above an outer section of the susceptor. The second proximity sensor may be positioned at a radial distance $R_2$ from the centerline, so that the sensor may be positioned above a recess in the susceptor. The third proximity sensor may be positioned at a radial distance $R_3$ from the centerline, so that the sensor is above an inner section of the susceptor. In some embodiments, the three or more proximity sensors may be distributed circumferentially around the process fixture at the different radial distances from the center. In various embodiments, the at least three proximity sensors may be capacitive displacement sensors, inductive displacement sensors, or a combination thereof.

In various embodiments, measuring changes in distance between the sensor and susceptor using the proximity sensor that passes over the susceptor recess as the susceptor rotates allows for the identification of whether the wafer has an eccentric position within a recess of the susceptor.

In various embodiments, the proximity (e.g., capacitance, inductance) sensor(s) can operate at higher temperatures and in smaller spaces than typical optical solutions. Such sensors can make measurements under actual process conditions to routinely confirm and maintain accurate wafer placement and gap control. Results of these measurements can be fed back to the wafer handling system controller to automatically maintain optimal wafer placement and gap control.

In various embodiments, a wafer handling robot can be trained to place wafers accurately into a process chamber using mechanical fixturing (e.g. reference pins) and video feedback (e.g. camera wafers). However, robot placement performance and the optimal wafer placement location (e.g. pocket or pedestal center) can move as the chamber is heated and cooled as part of a process sequence. Accordingly, one or more embodiments of the invention provide apparatus and methods to increase accuracy of wafer placement.

In various embodiments, the controller may be in electronic communication with the wafer handling robot, and provide in situ feedback regarding the positioning of one or more wafers in the one or more recesses of a susceptor obtained from the one or more proximity sensors. The measurements of the gap distance $D_G$ of a wafer may be used to adjust the motion of the wafer handling robot to compensate for variations in susceptor shape, and/or recess movement and positioning.

In various embodiments, detection of an eccentric wafer position may be utilized to recalculate placement of subsequent wafers by the wafer handling robot in the recesses of the susceptor to avoid having wafers at least partially outside of the recess and compensate for eccentric wafer positions. In various embodiments, adjustments calculated by a controller may be communicated to the wafer handling robot to adjust the positioning and motion of the wafer handling robot.

Various exemplary embodiments of the invention are described in more detail with reference to the Figures. It should be understood that these drawings only illustrate some of the embodiments, and do not represent the full scope of the present invention for which reference should be made to the accompanying claims.

FIG. 1A illustrates a side view of an exemplary embodiment of a processing fixture 100 and a susceptor 200. In various embodiments, the processing fixture comprises a processing fixture body 110 having one or more openings 120, where each opening may be configured and dimensioned to receive a proximity sensor 130. The opening(s) 120 may be positioned a radial distance from the center of the processing fixture and/or the axis of rotation 50 of the susceptor 200. The proximity sensor(s) 130 may be in electrical communication with a meter and/or controller over an electrical path 139. The processing fixture may further comprise a processing fixture top surface 112, a processing fixture bottom surface 117, and having a thickness between the processing fixture top surface 112 and the processing fixture bottom surface 117. The processing fixture bottom surface 117 is opposite the processing fixture top surface 112, and may be substantially parallel with the processing fixture top surface 112. The processing fixture bottom surface 117 may form a substantially horizontal plane that may be parallel with a susceptor plate top surface 212. The one or more openings may be formed in the processing fixture bottom surface 117. In various embodiments, the openings may be through-holes through the thickness of the processing fixture thickness.

In various embodiments, a controller in electrical communication with at least three proximity sensors, receives electrical signals from the proximity sensors over an electrical path and determines the distances between the at least three proximity sensors and surface features below the at least three proximity sensors, and provides an alarm if the distances are outside of an intended range. The alarm may provide an audible indication (e.g., a siren), a visual indication (e.g., a flashing light, an image on a display), or a combination thereof, of wafer misalignment. The controller may interrupt processing of the wafer if the distances are outside of an intended range or a wafer is misaligned.

The controller may be a computer, which may be a single board computer, a laptop computer, a desktop computer, a server, a mainframe, a pad, a tablet, an application specific integrated circuit (ASIC), or other analog and digital electronic circuitry known in the art. The controller may receive the electronic signals from the proximity sensors and perform data acquisition, which may be used for subsequent calculations and determinations, and send electronic signals to motors, actuators, valves, and other components. A computer may comprise transitory and non-transitory memory for storing programs, acquired data, and calculated values. The controller may also communicate and interact with various meters connected to and in electrical communication with the proximity sensors. The non-transient computer readable medium may be the non-transitory computer memory, such as hard drives, optical drives (CD, DVD, Blu-ray), flash drives, and other removable or non-removable memory.

In various embodiments, the susceptor comprises a susceptor plate 210 comprising a susceptor plate top surface 212, a susceptor plate bottom surface 217, and having thickness between the susceptor plate top surface 212 and the susceptor plate bottom surface 217. The susceptor plate top surface 212 forms a substantially horizontal plane that may support objects placed thereon. The susceptor plate bottom surface 217 is opposite the susceptor plate top surface 212, and may be substantially parallel with the susceptor plate top surface 212.

In various embodiments, the susceptor may further comprise a support post 220, which may be positioned in the center of the susceptor plate 210, and may define the axis of rotation 50 of the susceptor 200. The support post 220 may be a separate component affixed to the susceptor plate 210 or an integral portion of the susceptor plate 210 where both the support post 220 and susceptor plate 210 are made from the same piece of material (e.g., by casting and/or machining).

In various embodiments, the susceptor may be made of a conductive materials (e.g., metals), non-conductive materials (e.g., carbon, graphite), or combinations thereof.

In various embodiments, one or more recesses 230 may be formed in the susceptor plate top surface 212 of the susceptor plate 210. In some embodiments, the recess(es) 230 may have a depth that is less than the thickness of the susceptor plate 210, a supporting face 235 upon which a wafer may rest, and a wall around the periphery of the supporting face 235. In some embodiments, the recess(es) may have a horizontal ledge that can support the edge of a wafer placed thereon.

In some embodiments, as shown in FIG. 1A, the recess 230 in the top surface 212 of the susceptor 200 is sized so that a wafer 300 supported in the recess 230 has a top surface 320 substantially parallel with the top surface 212 of the susceptor 200. A wafer that has a top surface 320 that is coplanar with the top surface 212 of the susceptor 200 may also be referred to as the wafer 300 being flush with the top surface 212.

As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

In various embodiments, the processing fixture 100 is in spatial relationship with the susceptor 200, such that the bottom surface 117 of the processing fixture 100 is above and substantially parallel to the top surface 212 of the susceptor, and the center and/or axis of rotation of the susceptor 200 is substantially aligned with a centerline of the processing fixture. The bottom surface 117 of the processing fixture 100 is separated from the top surface 212 of the susceptor 200 by a distance $D_G$, which forms a gap between the two surfaces.

In various embodiments, the gap distance, $D_G$, is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

In various embodiments, the gap distance $D_G$ may be adjusted by raising and/or lowering the susceptor 200. In some embodiments, the height of the susceptor 200 in a processing chamber may be adjusted with a height adjustment device operatively associated with the susceptor support post 220.

In various embodiments, the one or more proximity sensor(s) 130 may be capacitive or inductive displacement sensor(s) that can generate an electrical signal that is related to the distance between the operative face of the sensor and a surface positioned under the operative sensor face 137. In some embodiments, the proximity sensor may generate a signal, which may comprise a voltage and/or current, that is proportional to the measured distance between the operative sensor face 137 and the surface directly opposite the operative sensor face 137, which may be the susceptor top surface 212, the recess supporting face 235, or the top face of a wafer positioned on the susceptor top surface 212 or at least partially in a recess 230. In some embodiments in which the operative sensor face 137 of the proximity sensor 130 is even or flush with the bottom surface 117 of the processing fixture 100 and opposite at least a portion of the susceptor top surface 212, the measured distance may equal the gap distance $D_G$. In some embodiments in which the operative sensor face 137 of the proximity sensor 130 is not even or flush with the bottom surface 117 of the processing fixture 100, an offset may be included to calculate the gap distance $D_G$ from the measured distance.

In various embodiments, capacitive displacement sensors may have a sensitivity range of about 0.2 nm to about 28 nm for a gap distance range of about 0.1 mm to about 5.0 mm, or a sensitivity range of about 0.2 nm to about 12 nm for a gap distance range of about 0.1 mm to about 2.0 mm, or a sensitivity range of about 0.8 nm to about 7 nm for a gap distance range of about 0.5 mm to about 1.25 mm, where the sensitivity may be the vertical resolution at the measurement range.

Figure 1B:
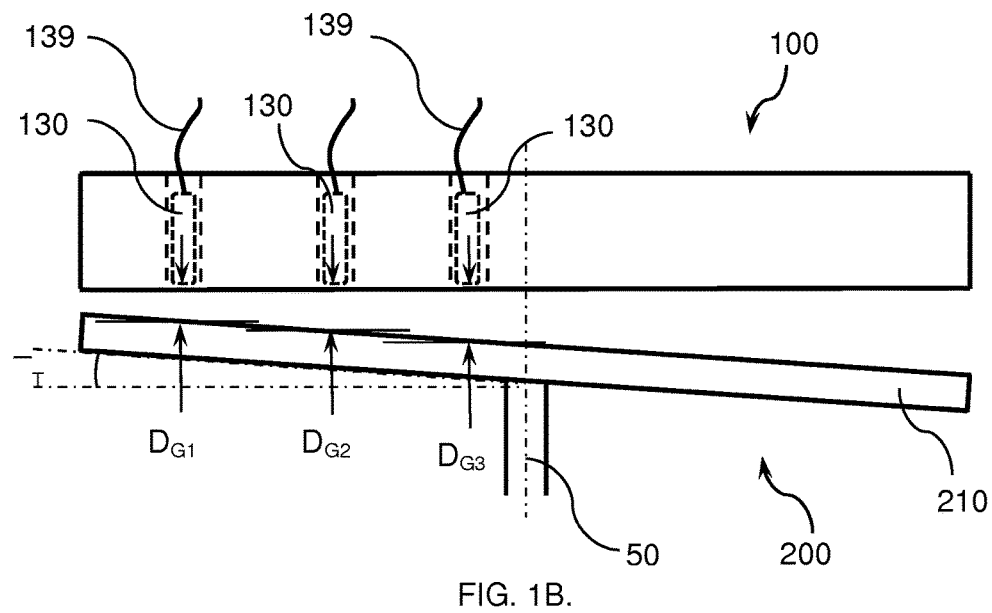
FIG. 1B illustrates a side view of an exemplary embodiment of a process fixture and a susceptor depicting tilt of the susceptor.

FIG. 1B illustrates a side view of an exemplary embodiment of a process fixture and a susceptor depicting tilt of the susceptor. During operation and over time, a susceptor may experience some warping, sagging, changes in alignment, or other deformation of the susceptor plate shape and/or dimensions. These changes in the susceptor plate shape and/or dimensions may be temporary, for example due to changes in processing temperatures, or permanent, for example due to improper mounting of a susceptor plate 210 on a support post 220, or inelastic stresses and/or strains.

In some embodiments, such changes in the susceptor plate alignment, shape and/or dimensions may be detected by the one or more proximity sensors 130 measuring the gap distance $D_{G1}, D_{G2}, D_{G3}$ between the operative sensor face 137 and the surface opposite the operative sensor face 137. Differences in the measured values of the one or more gap distances $D_{G1}, D_{G2}, D_{G3}$ can indicate that the susceptor plate is tilted, and an angle of tilt $\theta_T$ may be calculated from the relationship between the known positioning of the proximity sensors 130 and the differences in the measured gap distances $D_{G1}, D_{G2}, D_{G3}$. An angle of tilt $\theta_T$ greater than a predetermined threshold value may be used to indicate for example by an alarm that the susceptor is out of tolerance and needs to be serviced or replaced.

Figure 2A:
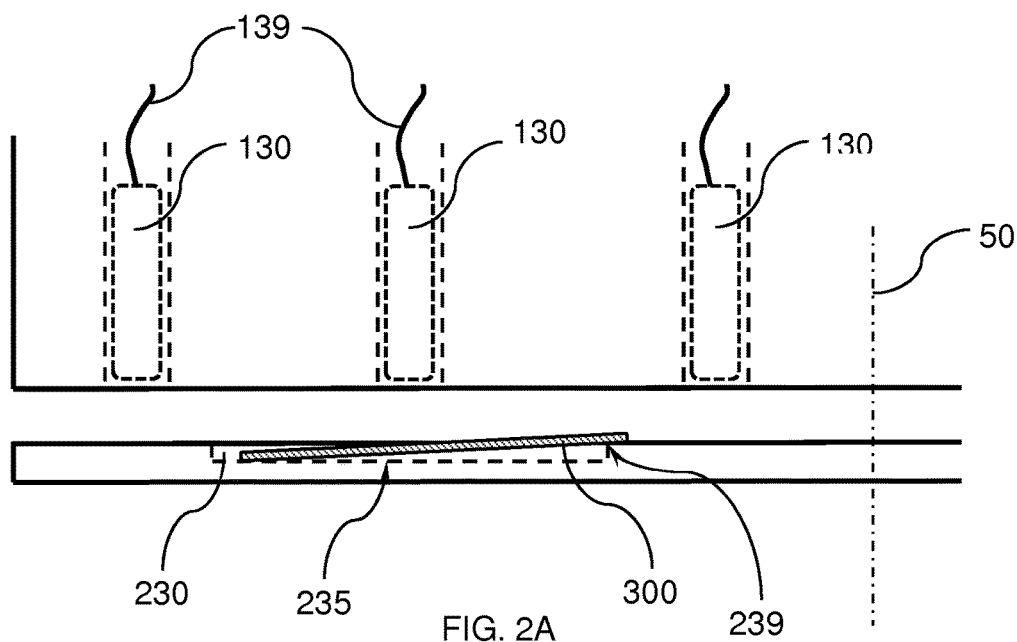
FIG. 2A illustrates a side view of an exemplary embodiment of a portion of a process fixture and susceptor depicting the improper seating of a wafer.

FIG. 2A illustrates a side view of an exemplary embodiment of a portion of a process fixture 100 and susceptor 200 depicting the improper seating of a wafer within a recess of the susceptor plate. When a wafer is improperly placed in a recess 230, an edge of the wafer 300 may rest upon the support face 235 of the recess 230 and a surface of the wafer 300 may rest on an edge of the recess 239, so that the wafer is at an incline and at least partially outside of the recess 230.

In various embodiments, at least one proximity sensor may be located in the processes fixture 100 at a position that at least temporarily passes above at least a portion of a recess 230, which may contain a wafer 300. The at least one proximity sensor may detect a gap distance that is different from a value that would be measured if the wafer were flush in the recess. In some embodiments, the at least one proximity sensor may cross the recess middle third of the recess.

In various embodiments, whether the wafer is substantially coplanar with the recess may be determined by comparing the measured gap distance to an expected value when the wafer is substantially coplanar with the recess.

Figure 2B:
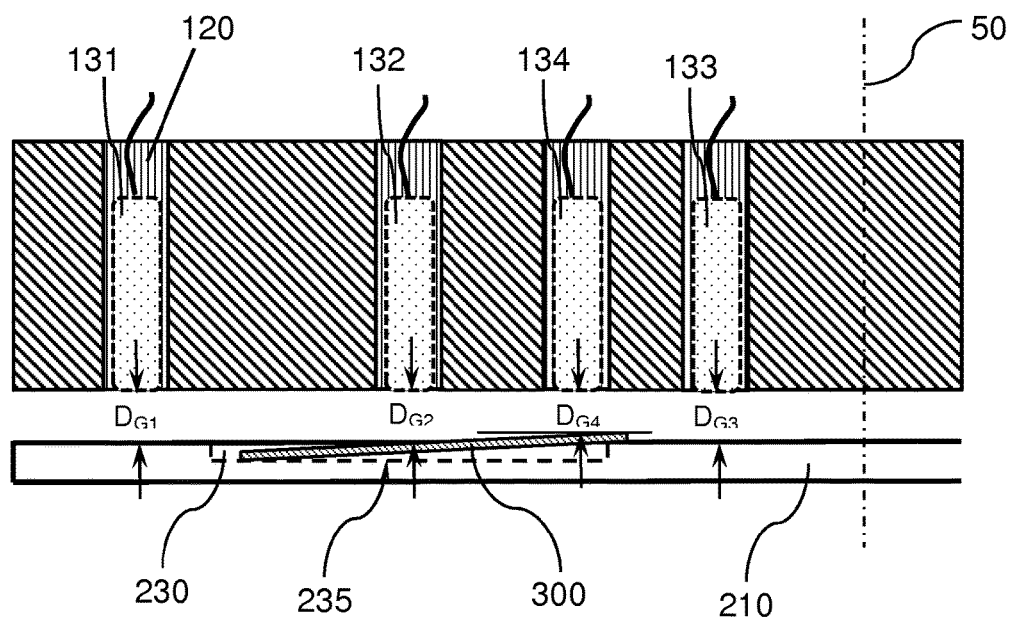
FIG. 2B illustrates another view of an exemplary embodiment of a process fixture and operatively associated susceptor.

FIG. 2B illustrates a cut-away side view of an exemplary embodiment of a process fixture 100 and operatively associated susceptor 200 depicting the improper seating of a wafer within a recess of the susceptor plate 210. A portion of the process fixture 100 and a portion of the susceptor 200 show the placement of four (4) proximity sensors retained in openings 120 located over different portions of a susceptor 200. In an embodiment, a first proximity sensor 131 is located farthest from the axis of rotation 50 and closest to the outer edge of the process fixture 100 and susceptor 200, and measures a first gap distance $D_{G1}$, a second proximity sensor 132 is located at a position in the processing fixture 100 that approximately coincides with a center portion of one or more recesses 230 in the operatively associated susceptor 200, so that the sensor 132 passes over one or more recesses, and measures a second gap distance $D_{G2}$. A third proximity sensor 133 is located closest to the axis of rotation 50 and farthest from the edge of the processing fixture 100 and susceptor 200, and measures a third gap distance $D_{G3}$, and a forth proximity sensor 134 is located between the second proximity sensor 132 and third proximity sensor 133, where the forth proximity sensor 134 is located at a position in the processing fixture 100 that approximately coincides with a wall 237 of the one or more recesses 230, and measures a forth gap distance $D_{G4}$.

In various embodiments, the proximity sensors 131,132, 133,134 may be in electrical communication with a meter and/or controller that can detect an electrical signal from the proximity sensors and calculate the gap distances $D_{G1}, D_{G2}, D_{G3}, D_{G4}$, to determine whether the susceptor plate 210 is parallel to the bottom surface of the processing fixture 100, and/or whether a wafer 300 is properly seated within a recess 230.

In various embodiments, a controller may receive the electrical signals over an electrical path and determine distance values from the electrical signals. The distance values may be stored on a non-transient computer readable medium and/or used to measure and compare the distance values in approximately real-time.

In various embodiments, the baseline gap distance and measured gap distances may be stored in a non-transient computer readable medium for subsequent calculations and statistical analysis.

As a non-limiting example, a parallel top surface 212 of the susceptor plate 210 and properly seated wafer that is flush with the top surface 212 of the susceptor plate 210 may produce distance values for proximity sensors 131, 132, 133, 134 in which $D_{G1}=D_{G2}=D_{G3}=D_{G4}$ within expected tolerances and variations. In contrast, when a wafer has not been properly placed within a recess 230, so that the wafer is not properly seated, the proximity sensor 132 that passes above the recesses may provide an electrical signal that equates to a distance value that is less than or greater than the value expected when the wafer is flush, such that $D_{G2} \neq D_{G1}$ and/or $D_{G3}$. Similarly, an unseated wafer may produce a distance value that is less than expected because an edge of the wafer is above the top surface 212 of the susceptor plate 210. The proximity sensor 134 that approximately coincides with a wall 237 of the one or more recesses 230 may provide an electrical signal that equates to a distance value that is less than the value expected when the wafer is flush, such that $D_{G4} \leq D_{G1}$ and/or $D_{G3}$. In an embodiment, a controller may also compare the measured values of $D_{G4}$ and $D_{G2}$, such that if $D_{G4} \neq D_{G2}$, indicates that the wafer is not properly seated.

Figure 3:
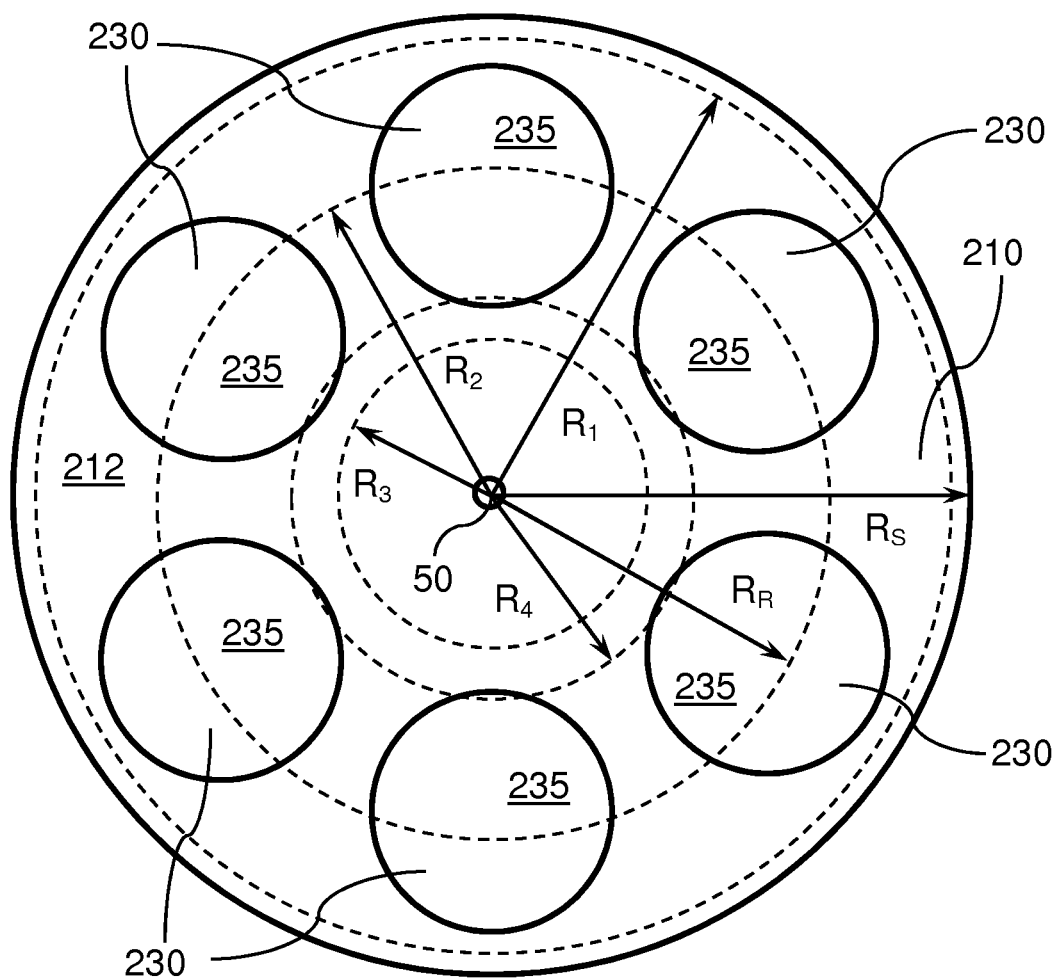
FIG. 3 illustrates a top view of an exemplary embodiment of a susceptor.

FIG. 3 illustrates a top view of an exemplary embodiment of a susceptor 200 having a radius $R_S$ and six (6) recesses 230 shown, in which the top surface 212 of the susceptor plate 210 and the support faces 235 of the recesses 230 are visible. The path(s) that one or more proximity sensors may trace around the top surface 212, as the susceptor rotates, are shown as dashed lines. The one or more proximity sensor(s) may be positioned in an operatively associated processing fixture (not shown) a predetermined radial distance from the axis of rotation 50 that coincides with features of the susceptor 200, which are intended to be monitored.

In various embodiments, one or more recesses having an inside diameter may be arrange circumferentially around the susceptor, where the center(s) of the one or more recess(es) may be located a distance $R_R$ from the axis of rotation of the susceptor. In various embodiments, the distance $R_R$ to the center of the recess(es) is approximately equal to the distance $R_2$ from the axis of rotation 50 of the susceptor to an opening and proximity sensor, so a proximity sensor passes over the center of the recess(es) as the susceptor rotates.

In an embodiment, as shown in FIG. 3, an opening and proximity sensor may be located at a position in an operatively associated processing fixture that is at a distance $R_1$ from the axis of rotation 50 of the susceptor 200, which coincides with a portion of the top surface 212 of the susceptor plate 210 that is beyond the recesses and may be uninterrupted by other surface features. The proximity sensor located the distance $R_1$ from the axis of rotation 50 may be closest to the edge of the susceptor plate 210 and processing fixture.

In various embodiments, surface features may include recesses and gaps distance changes created by the positioning of a wafer in the recess.

In an embodiment, as shown in FIG. 3, an opening and proximity sensor may be located at a position in an operatively associated processing fixture that is at a distance $R_2$ from the axis of rotation 50 of the susceptor, which passes over and at least temporarily may coincide with approximately the center of the six recesses 230.

In an embodiment, as shown in FIG. 3, an opening and proximity sensor may be located at a position in an operatively associated processing fixture that is at a distance $R_3$ from the axis of rotation 50 of the susceptor, which coincides with a portion of the top surface 212 of the susceptor plate 210 that is closer than the recesses and may be uninterrupted by other surface features. The proximity sensor located the distance $R_3$ from the axis of rotation 50 may be farthest the edge of the susceptor plate 210 and processing fixture, and closest to the axis of rotation 50.

In an embodiment, as shown in FIG. 3, an opening and proximity sensor may be located at a position in an operatively associated processing fixture that is at a distance $R_4$ from the axis of rotation 50 of the susceptor, which passes through and at least temporarily may coincide with a wall 237 of the six recesses 230.

Also as indicated by FIG. 3, the openings and proximity sensors may be dispersed circumferentially around a processing fixture as shown by the arrows, while still tracing the same paths around the susceptor at radial distances $R_1$, $R_2$, $R_3$, and $R_4$ when the susceptor rotates.

While the susceptor 200 is depicted as a circular plate in FIG. 3, other shapes may be employed without departing from the spirit and scope of the present invention, for example the susceptor may have a square, pentagonal, hexagonal, or other polygonal shape.

In various embodiments, a wafer may be placed in one or more of the recesses 230, where the wafer(s) have an outside diameter that is less than the diameter of the recesses.

Figure 4A:
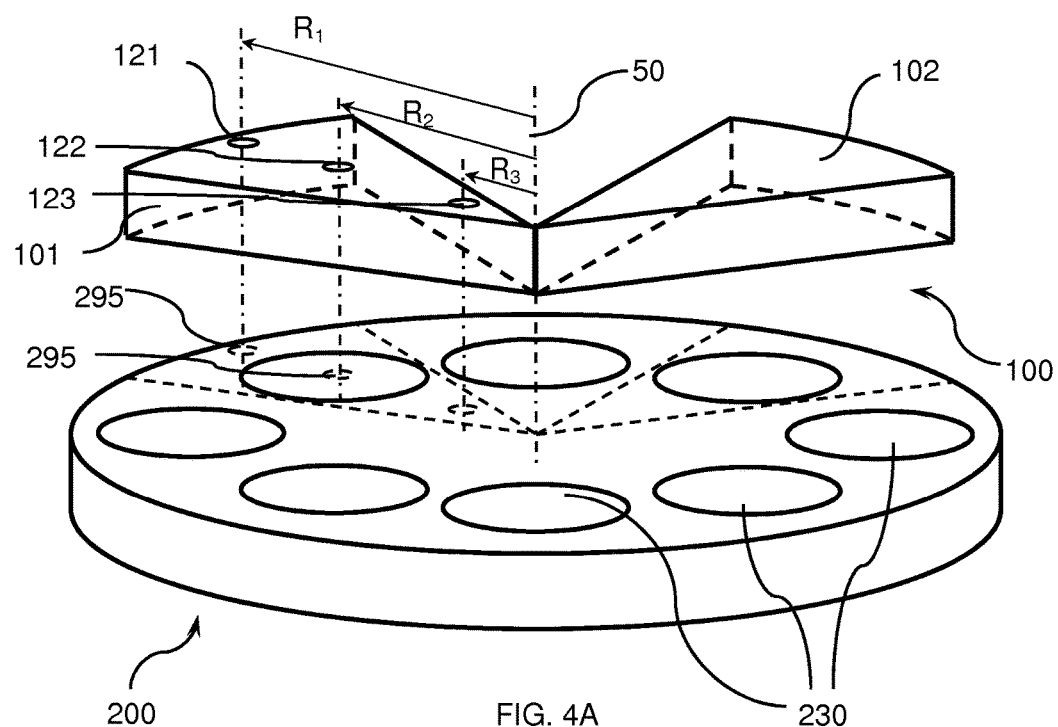
FIG. 4A illustrates an orthographic projection of an exemplary embodiment of a process fixture and susceptor.

FIG. 4A illustrates an orthographic projection of an exemplary embodiment of a process fixture and susceptor 200, where the process fixture comprises two wedge-shaped sections 101,102. In various embodiments, the susceptor may have one or more recesses, for example eight (8) recesses symmetrically placed around the susceptor 200 are shown in FIG. 4A. Three openings are shown in section 101 that are configured and dimensioned to retain a proximity sensor, and the coinciding position of each opening projected onto the susceptor 200 is depicted as a dashed circle 295. A first opening 121 is located a distance $R_1$ from the axis of rotation 50 of the susceptor and centerline of the processing fixture 100. A second opening 122 is located a distance $R_2$ from the axis of rotation 50 of the susceptor and centerline of the processing fixture 100. A third opening 123 is located a distance $R_3$ from the axis of rotation 50 of the susceptor and centerline of the processing fixture 100. As previously illustrated in FIG. 3, proximity sensors positioned in the openings 120 will trace a circular monitoring path over the surface of the susceptor, and measure the gap distance between the operative face of the sensor and the features on the top surface of the 210 of the susceptor 200, as the susceptor rotates around the axis of rotation 50.

In various embodiments, section 102 may comprise openings that may be in addition to the openings in section 101.

While FIG. 4A depicts the openings 121,122,123 arranged in a straight line on the same section 101 of the processing fixture, in other exemplary embodiments, each of the openings and proximity sensors may located on a different section of a processing fixture, but if an opening and sensor are still locate at each of the different radial distances $R_1$, $R_2$, and $R_3$, the same circumferential path will be scanned by the proximity sensors over a complete revolution of the susceptor. In various embodiments, the proximity sensors may scan a surface of the susceptor at a velocity of between about 10 mm/s and about 150 mm/s, or between about 50 mm/s and about 100 mm/s, or between about 55 mm/s and 90 mm/s, or at about 90 mm/s.

As wafers grow in size and throughput needs to be maximized leading to multiple wafers being processed simultaneously, the susceptor and process fixture size increases. In such systems there is a chance of droop along the susceptor plate, as well as the wafer away from the location of support (e.g., support post, recess ledges).

Figure 4B:
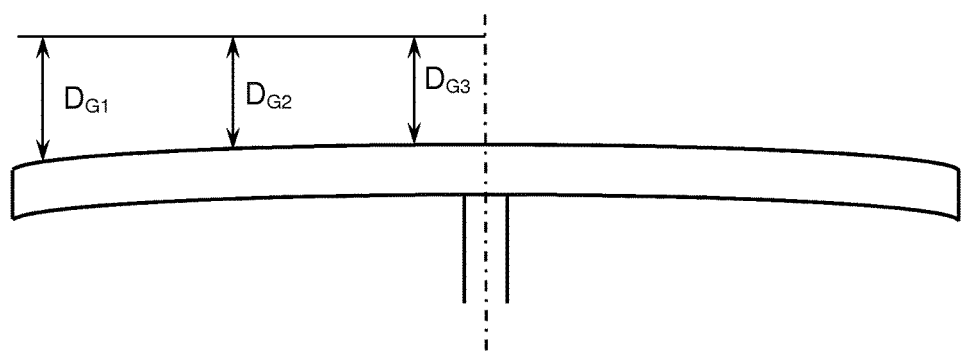
FIG. 4B illustrates an exemplary embodiment in which gap distance measurements at three different positions may detect the bowing of the susceptor.

FIG. 4B illustrates an exemplary embodiment in which gap distance measurements $D_{G1}, D_{G2}, D_{G3}$ at three different positions may detect the bowing of the susceptor, for example due to material fatigue, over-heating, or other plastic deformations. In various embodiments, the proximity sensors can continuously scan the top surface of the susceptor and monitor the changes in gap distance, and a controller can determine if $D_{G1} > D_{G2} > D_{G3}$ for at least a portion of a revolution of the susceptor.

In various embodiments, at least three openings and at least three proximity sensors retained within the at least three openings may be arranged in the processing fixture in a straight line, so that the proximity sensors may detect bowing of the susceptor.

Figure 4C:
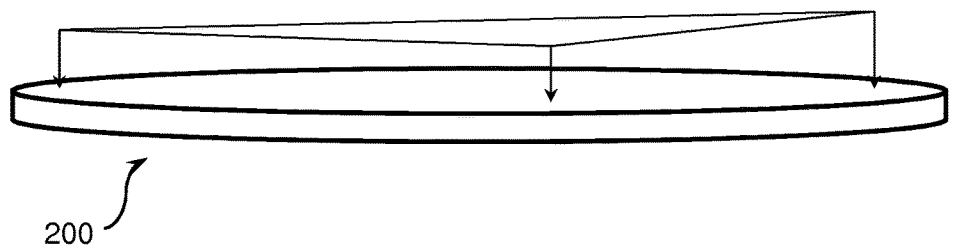
FIG. 4C illustrates an example of the mapping of a plane indicating a slope of the top surface of a susceptor.

FIG. 4C illustrates the mapping of a plane indicating a slope to the plane of the top surface of a susceptor 200. In various embodiments, the gap distance at three or more proximity sensor positions that do not form a straight line may be obtained simultaneously and the three values used to calculate a plane, where $ax+by+cz=d$. The three or more simultaneous measurements and calculation can determine if the susceptor is tilted in a specific direction and/or not parallel with an associated processing fixture.

In various embodiments, at least three openings and at least three proximity sensors retained within the at least three openings may be arranged in the processing fixture in a triangular pattern, so that the proximity sensors may provide measurements for at least the three points of a plane for detecting tilting of the susceptor.

Figures 5A, 5B, 5C:
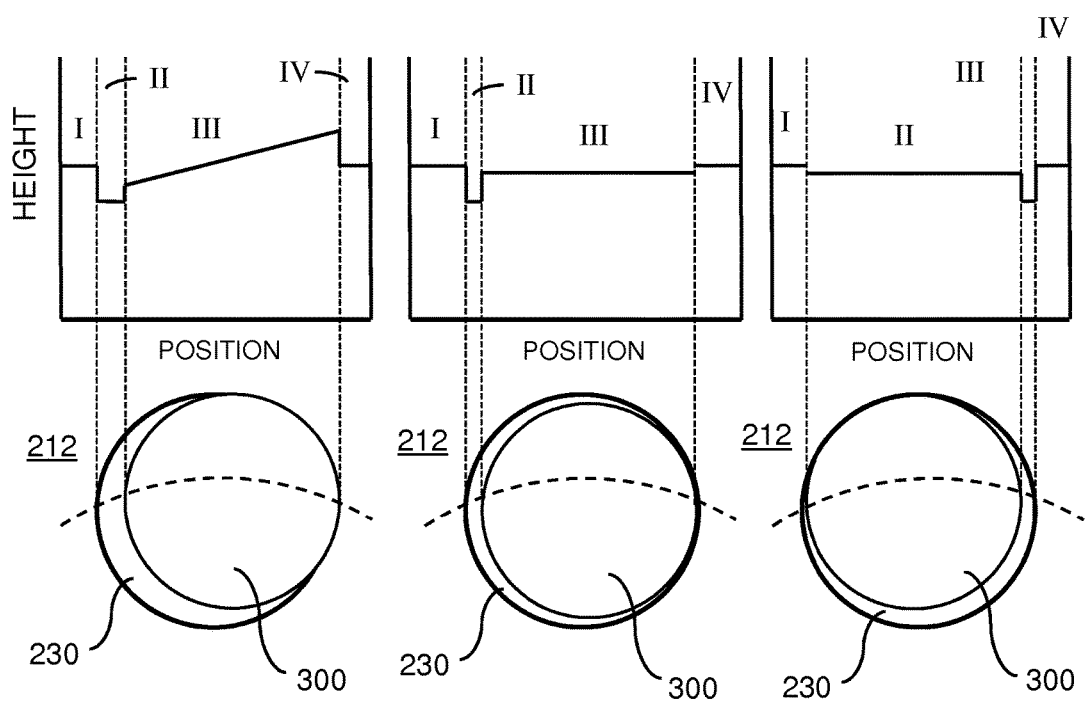
FIGS. 5A-5C illustrate examples of different possible eccentric positions for wafers at least partially in a recess.

FIGS. 5A-5C illustrate examples of different possible eccentric positions for wafers 300 at least partially in a recess 230 of a susceptor. Since wafers 300 have at least a slightly smaller outside diameter than the inside diameter of a recess to fit within the recess, there may be room for the wafer to shift positions. In a non-limiting example, the dashed line indicates an approximate path that a proximity sensor may scan as the susceptor rotates. A graph of the feature height, as related to the gap distance $D_G$, as the proximity sensor scans the susceptor surface and recess, is shown above each of the hypothetical wafer arrangements with the vertical dashed lines indicating changes in feature height due to changes in $D_G$ for the surface features.

In various embodiments, a baseline value for the gap distance may be established by measuring the gap distance at a reference point, for example a portion of the susceptor plate top surface that is known to be parallel to the operative face of the proximity sensor and uninterrupted by other surface features.

Typically, the locations of the wafer edges may be centered relative to the center of the recess and recess walls that define the optimal wafer placement location.

FIG. 5A illustrates an example of a wafer 300 that is at least partially outside of the recess 230, so that the wafer is not properly seated and has an angle of incline. A proximity sensor passing over the top surface 212 of a substantially horizontal susceptor may provide a base line for $D_G$ and feature heights, as shown in segment I of the graph. As the proximity sensor passes an edge of the recess 230, the sensor may detect a sudden increase in $D_G$, which indicates a decrease in feature height, as shown in segment II of the graph. As the proximity sensor reaches the edge of the eccentrically positioned wafer 300, the proximity sensor detects a decrease in $D_G$ and increase in feature height of approximately the wafer thickness followed by an approximately steady increase in feature height due to the incline of the wafer resting against the raised edge of the recess, as shown in segment III of the graph. An untilted wafer may not show any change in feature height as the wafer moves under the proximity sensor, were as detecting an approximately steady (e.g., linear) increase in feature height may indicate a tilted wafer. The measured feature height may increase above the baseline set by the top surface of the susceptor due to the portion of the wafer extending above the edge of the recess 230. A proximity sensor may detect a sudden decrease in feature height back to the base line for the top surface after the sensor has passed over the trailing edge of the wafer.

In various embodiments, a wafer that is at least partially outside of a recess may be determined by detecting a gap distance that increases or decreases linearly as the susceptor rotates.

In various embodiments, surface features, such as recesses and wafers, may be detected by rotating a susceptor around an axis of rotation, the susceptor comprising a top surface and one or more recesses, measuring a gap distance between an operative face of a proximity sensor and the top surface of the susceptor at one or more radial distances from the axis of rotation, detecting changes in the gap distance as the susceptor rotates around the axis of rotation, and determining the position of one or more surface features from the gap distances measured at one or more radial distances from the axis of rotation.

In various embodiments, the measured gap distance can be compared to the baseline gap distance and an increase in the gap distance may identify a leading edge of the one or more recesses as the susceptor rotates.

In various embodiments, an empty recess may be identified by detecting a gap distance that is larger than the baseline gap distance by approximately the known depth of the recess. The presence of a wafer in at least one of the one or more recesses may be identified by detecting a gap distance that is larger than the baseline gap distance, but less than the depth of the recess over a specific rotation of the susceptor.

FIG. 5B illustrates an example of a wafer 300 seated within the recess 230 and positioned to a side of the recess against a wall. A proximity sensor passing over the top surface 212 of a substantially horizontal susceptor may provide a base line for $D_G$ and feature heights, as shown in segment I of the graph. As the proximity sensor passes an edge of the recess 230, the sensor may detect a sudden increase in $D_G$, which indicates a decrease in feature height, as shown in segment II of the graph. As the proximity sensor reaches the edge of the eccentrically positioned wafer 300, the proximity sensor detects a decrease in $D_G$ and increase in feature height of approximately the wafer thickness, as shown in segment III of the graph. In addition, the difference between the baseline feature height in I and the feature height when passing over the wafer in III can indicate whether the wafer is approximately flush with the top surface 212 of the susceptor. Since in this example the wafer is against the wall of the recess 230 approximately where the proximity sensor passes, the proximity sensor may detect a slight increase in feature height equal to the distance that the top of the wafer 300 is below the top surface 212 of the susceptor, as shown in segment IV of the graph.

FIG. 5C illustrates an example of a wafer 300 positioned diagonally away from the center of the recess against a wall. As the proximity sensor passes an edge of the recess 230, the sensor may detect a sudden increase in $D_G$, which indicates a decrease in feature height, as shown in segment II of the graph. Since in this example only a minimal gap between the wafer and the recess wall is shown, the proximity sensor may not detect the space depending upon the lateral spatial resolution of the proximity sensor. In various embodiments, a proximity sensor may have a lateral spatial resolution approximately equal to the electric field size, and measures the average distance to the target under the sensing area of the proximity sensor, for example a proximity sensor may have a lateral spatial resolution of equal to or less than about 2.5 mm, or equal to or less than about 1.5 mm, or equal to or less than about 1.1 mm, where the lateral spatial resolution may depend upon the dimensions of the sensing area of the proximity sensor. As the proximity sensor passes an edge of the wafer 300, the sensor may detect a sudden increase in $D_G$, which indicates a decrease in feature height, as shown in segment III of the graph, which may be followed by an increase back to the baseline value as shown in segment IV of the graph.

In various embodiments, a proximity sensor passing approximately through the center of the recess during rotation may detect the size of the space to either side of the wafer and calculate the approximate eccentricity of the wafer's position relative to the recess walls and susceptor top surface. The eccentricity of a wafer position may be determined by measuring the lateral distance traversed by the susceptor between identify a leading edge of the recess and identifying the presence of a wafer in the recess.

In various embodiments, the rotation of the susceptor may be intermittent, for example where the susceptor stops for loading or unloading wafers, and the measuring of the gap distances between the operative face of a proximity sensor and the top surface of the susceptor may be conducted when the susceptor is rotating.

In various embodiments, the rotation of the susceptor may be continuous, and the measuring of the gap distances between the operative face of a proximity sensor and the top surface of the susceptor may be continuous.

Figure 6:
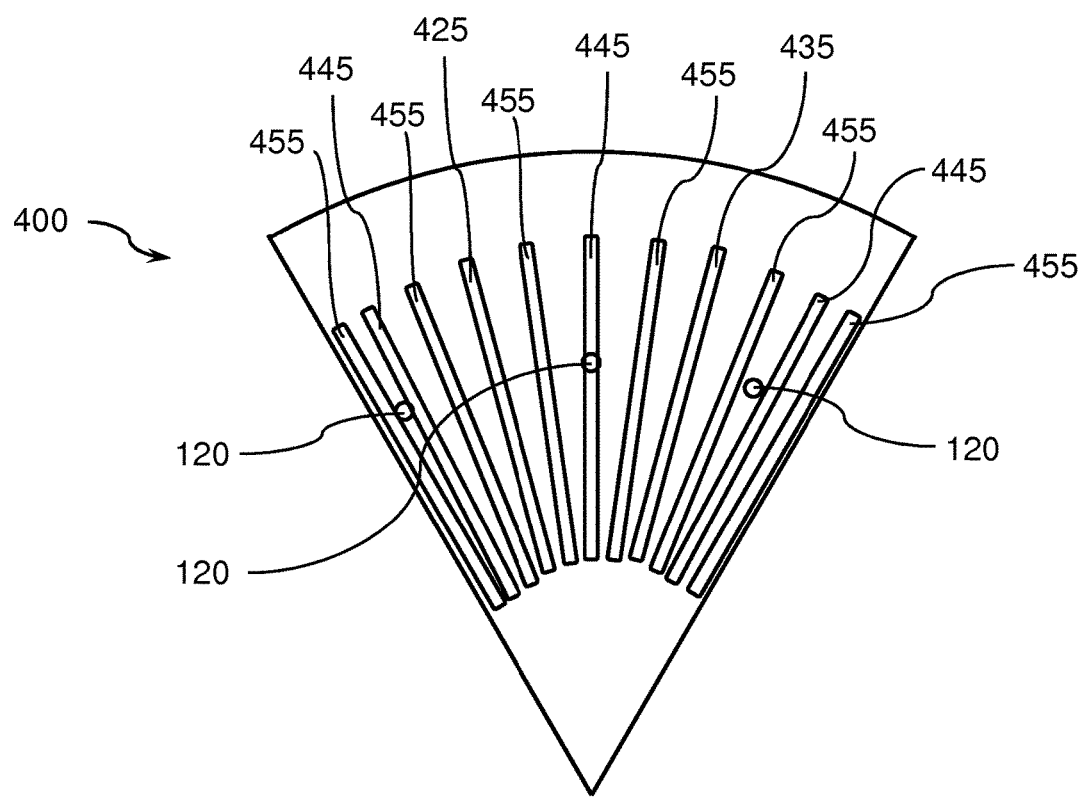
FIG. 6 illustrates an exemplary embodiment of an injector for atomic layer deposition (ALD)

FIG. 6 illustrates a process fixture comprising an injector 400 that may introduce gas(es) for atomic layer deposition (ALD). The injector may comprise a series of channels that may be sequentially arranged and configured and dimensioned to deliver or evacuate gasses from a gap between the injector and a susceptor. Such processing fixture/injector may also be referred to as gas showerhead.

In various embodiments, the channels may be arranged in an operative sequence, where a channel that delivers a reactive gas to the gap has channels that evacuate gases at least on either side of the gas delivery channel. In some embodiments, a channel that evacuates gases may surround the channel that delivers the reactant gas. In some embodiments, a channel that delivers a non-reactive purge gas may be adjacent to at least one channel that evacuates gases. In some embodiments, a channel that delivers non-reactive purge gas may surround the channel that evacuates gases.

In various embodiments, the one or more opening(s) for the proximity sensors may be located in different parts of an ALD injector, for example within a gas delivery channel, within an evacuation channel, or within a wall separating two channels.

In an embodiment, an opening and sensor may be located within a gas delivery channel that delivers a purge gas to reduce or prevent reactive deposition gases entering at a different channel from depositing on the operative face of the sensor. The formation of unintended layers of material on an operative face of a proximity sensor may change the electrical characteristics of the sensor and affect the measured distance values, which may render the proximity sensor inoperative.

In some embodiments, an opening and sensor in an ALD injector may be separated from a gas delivery channel by at least an evacuation channel.

In some embodiments, an opening and sensor in an ALD injector may be separated from a gas delivery channel by at least a purge gas channel and an evacuation channel.

A non-limiting example, as illustrated in FIG. 6, may comprise (from left to right) a gas evacuation channel 455 at a periphery of the injector, a purge gas channel 445 adjacent to the gas evacuation channel 455, a gas evacuation channel 455 adjacent to the purge gas channel 445, a reactant gas channel 425 for delivering a reactant gas, A, adjacent to the gas evacuation channel 455, a gas evacuation channel 455 adjacent to the reactant gas channel 425, a purge gas channel 445 adjacent to the gas evacuation channel 455, a gas evacuation channel 455 adjacent to the purge gas channel 445, a reactant gas channel 435 for delivering a reactant gas, B, adjacent to the gas evacuation channel 455, a gas evacuation channel 455 adjacent to the reactant gas channel 435, a purge gas channel 445 adjacent to the gas evacuation channel 455, and at the far right a gas evacuation channel 455 adjacent to the purge gas channel 445.

In various embodiments, an opening 120 for a sensor may be located in a wall separating a gas evacuation channel 455 from an adjacent purge gas channel 445, where the purge gas channel 445 is closer to a reactant gas channel 425,435 than the opening. Placing the opening 120 on the far side of the purge gas channel 445 from the reactant gas channel 425, 435 provides a screen of non-reactive gas that reduces or prevents reactive gases from reaching the operative face of a proximity sensor held in the opening 120.

In various embodiments, an opening 120 for a sensor may be located in a wall separating a gas evacuation channel 455 from an adjacent purge gas channel 445, where the gas evacuation channel 455 is closer to a reactant gas channel 425,435 than the opening 120, as shown in FIG. 6. Placing the opening 120 on the far side of the gas evacuation channel 455 from the reactant gas channel 425,435 allows the reactant gas(es) to be evacuated to reduce or prevent the reactive gas(es) from reaching the operative face of a proximity sensor held in the opening 120.

In various embodiments, an opening 120 for a sensor may be located in a purge gas channel 445, so the purge gas flows directly over the operative face of a proximity sensor held in the opening 120, as shown in FIG. 6. Placing the opening 120 in the purge gas channel 445 provides a screen of non-reactive gas that reduces or prevents reactive gases from reaching the operative face of a proximity sensor held in the opening 120.

In an embodiment, the process fixture is an injector for atomic layer deposition comprising at least eleven channels, where at least three of the channels deliver a purge gas, and at least three openings and at least three proximity sensors are located within the purge gas channels.

In an embodiment, the process fixture is an injector for atomic layer deposition comprising at least eleven channels, where two channels deliver a reactant gas, at least three of the channels deliver a purge gas, at least six channels are under vacuum to evacuate gases, and a wall separates adjacent channels, and the at least three openings and at least three proximity sensors are located within the walls between a purge gas channel and a vacuum channel.

Figure 7:
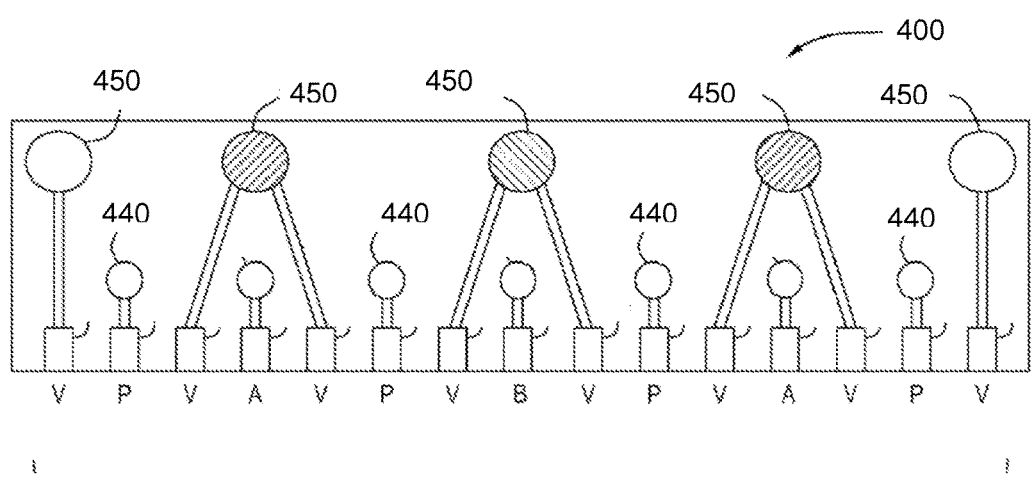
FIG. 7 illustrates an exemplary embodiment of an ALD injector.

FIG. 7 illustrates cross-sectional view of an exemplary embodiment of an ALD injector 400 depicting a sequential arrangement of substantially parallel channels for delivering reactive gases A and B, purge gas P, and evacuating gases by vacuum V. Conduits 440 deliver a purge gas to the purge gas P channels and conduit 450 are connected to and in fluid communication with the vacuum V channels. As used in this specification and the appended claims, the term "substantially parallel channels," used in this respect, means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel.

Figure 8:
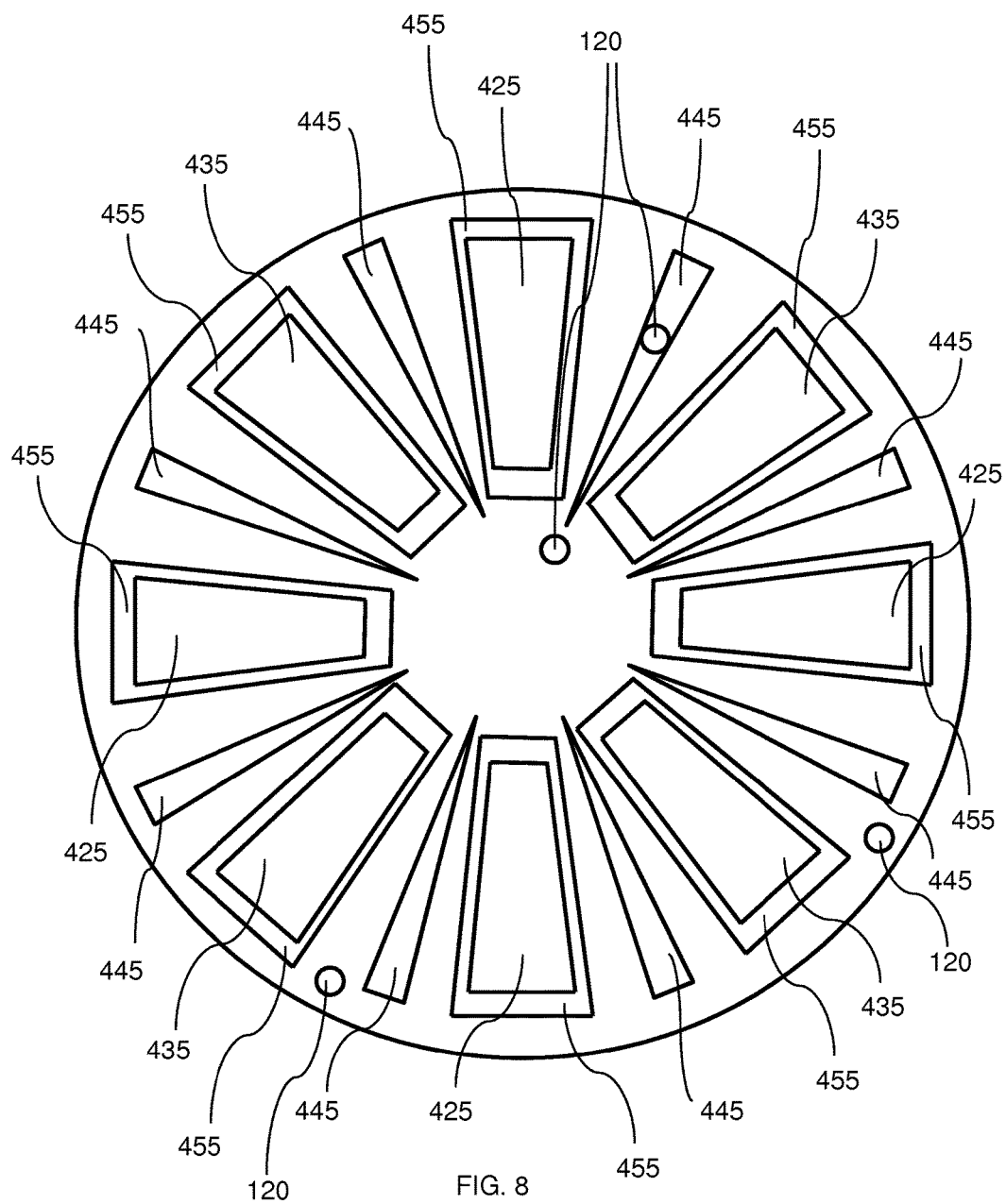
FIG. 8 illustrates an exemplary embodiment of an ALD injector.

A non-limiting example of an injector, as illustrated in FIG. 8, may comprise a plurality of gas evacuation channels 455 surrounding wedge-shaped reactant gas channels 425, 435, and wedge-shaped purge gas channels 445 situated in between the gas evacuation channels 455, arranged in a pattern around a circular injector. A reactant gas channel 425 may deliver a reactant gas, A, and a reactant gas channel 435 may deliver a reactant gas, B.

In various embodiments, openings 120 for a sensor may be located in a wall separating a gas evacuation channel 455 from an adjacent purge gas channel 445, and/or within a purge gas channel 445. Placing the opening 120 within the purge gas channel 445 and separated from the reactant gas channel 425,435 by a gas evacuation channel 455, provides a screen of non-reactive gas that reduces or prevents reactive gases from reaching the operative face of a proximity sensor held in the opening 120.

In various embodiments, the openings 120 and proximity sensors 130 may be arranged in a straight line, in a triangular pattern, or a random pattern. If the proximity sensors are not perfectly flush with the surface of the injector, then the offset amount can be included in any calculations of $D_G$.

Embodiments relate to a method of using a proximity sensor to detect changes in height, record the lateral position of the wafer edges relative to the locations of wafer registration fixtures in the chamber, and determine the positioning of the wafer in the recess.

It will be recognized that the processes, materials and devices of embodiments of the invention provide several advantages over currently known processes, materials and devices for photoresist.

Although the invention herein has been described with reference to particular embodiments, it is to be understood that these embodiments are merely illustrative of the principles and applications of the present invention. It will be apparent to those skilled in the art that various modifications and variations can be made to the material, method, and apparatus of the present invention without departing from the spirit and scope of the invention. Thus, it is intended that the present invention include modifications and variations that are within the scope of the appended claims and their equivalents.

What is claimed is:

1. An apparatus comprising:
   a processing fixture comprising a processing fixture body having a processing fixture bottom surface, at least three openings in the processing fixture body;
   at least three proximity sensors retained within at least three of the openings in the processing fixture body; and
   a susceptor comprising a susceptor plate having a susceptor plate top surface, a susceptor center point, and one or more recesses formed in the susceptor plate top surface a distance $R_R$ from the susceptor center point;
   wherein the susceptor plate top surface and the processing fixture bottom surface are substantially parallel, and the susceptor plate top surface is separated from the processing fixture bottom surface by a gap distance $D_G$; and each of the at least three proximity sensors have an operative face substantially parallel to the susceptor plate top surface, and a first opening is located a distance $R_1$ from the susceptor center point, a second opening is located a distance $R_2$ from the susceptor center point, and a third opening is located a distance $R_3$ from the susceptor center point, $R_2 = R_R$ and $R_1 > R_2 > R_3$, and the proximity sensors are capacitive displacement sensors with a sensitivity range of about 0.2 nm to about 28 nm for a gap distance range of about 0.1 mm to about 5.0 mm.

2. The apparatus of claim 1, wherein the processing fixture body comprises four openings and four proximity sensors retained within the four openings, wherein the fourth opening is located a distance $R_4$ from the susceptor center point, and $R_2 > R_4 > R_3$.

3. The apparatus of claim 1, which further comprises a controller in electrical communication with the at least three proximity sensors, where the controller receives electrical signals over an electrical path and determines the distances between the at least three proximity sensors and surface features below the at least three proximity sensors and provides an alarm if the distances are outside of an intended range; and the susceptor further comprises a support post which defines an axis of rotation for the susceptor.

4. The apparatus of claim 1, wherein the at least three openings and at least three proximity sensors retained within the at least three openings are arranged in the processing fixture in a straight line, so that the proximity sensors may detect bowing of the susceptor.

5. The apparatus of claim 1, wherein the at least three openings and at least three proximity sensors retained within the at least three openings are arranged in the processing fixture in a triangular pattern, so that the proximity sensors may provide measurements for detecting tilting of the susceptor.

6. The apparatus of claim 1, wherein the processing fixture is an injector for atomic layer deposition comprising at least eleven channels, where at least three of the channels deliver a purge gas, and the at least three openings and at least three proximity sensors are located within purge gas channels.

7. The apparatus of claim 1, wherein the processing fixture is an injector for atomic layer deposition comprising at least eleven channels, where at least three of the channels deliver a purge gas, at least six channels are under vacuum to evacuate gases, and a wall separates adjacent channels, and the at least three openings and at least three proximity sensors are located within the walls between a purge gas channel and a vacuum channel.

8. An apparatus comprising:
a processing fixture comprising a processing fixture body having a processing fixture top surface, a processing fixture bottom surface opposite the processing fixture top surface, a thickness between the processing fixture top surface and the processing fixture bottom surface, and three or more openings in the processing fixture bottom surface;
a susceptor comprising
a susceptor plate having a susceptor plate top surface, a susceptor plate bottom surface opposite the susceptor plate top surface, a thickness between the susceptor plate top surface and the susceptor plate bottom surface, and one or more recesses in the susceptor plate top surface, wherein the susceptor plate top surface and the processing fixture bottom surface are substantially parallel, and the susceptor plate top surface is separated from the processing fixture bottom surface by a gap distance $D_G$; and
a support post affixed to the susceptor plate that defines an axis of rotation of the susceptor, wherein the one or more recesses in the susceptor plate top surface are a distance $R_R$ from the axis of rotation;

three or more capacitive displacement sensors that measures the gap distance, wherein each of the three or more capacitive displacement sensors are retained within one of the three or more openings in the processing fixture bottom surface, each of the three or more capacitive displacement sensors have an operative face substantially parallel to the susceptor plate top surface, and each of the capacitive displacement sensors have a sensitivity range of about 0.2 nm to about 28 nm for a gap distance range of about 0.1 mm to about 5.0 mm; and wherein a first of the three or more capacitive displacement sensors is located a distance $R_1$ from the axis of revolution, a second of the three or more capacitive displacement sensors is located a distance $R_2$ from the axis of revolution, and a third of the three or more capacitive displacement sensors is located a distance $R_3$ from the axis of revolution, wherein $R_2 = R_R$ and $R_1 > R_2 > R_3$.

9. A method comprising:
rotating a susceptor around an axis of rotation, the susceptor comprising a top surface and one or more recesses a distance $R_R$ from the axis of rotation;
measuring a gap distance $D_G$ between an operative face of a capacitive displacement sensor within a processing fixture bottom surface and the top surface of the susceptor at at least three radial distances from the axis of rotation using at least three capacitive displacement sensors retained within at least three openings in the processing fixture bottom surface, a first opening is located a distance $R_1$ from the axis of rotation, a second opening is located a distance $R_2$ from the axis of rotation, and a third opening is located a distance $R_3$ from the axis of rotation, $R_2 = R_R$ $R_1 > R_2 > R_3$, and the capacitive displacement sensors have a sensitivity range of about 0.2 nm to about 28 nm for a gap distance range of about 0.1 mm to about 5.0 mm;
detecting changes in the gap distance as the susceptor rotates around the axis of rotation; and
determining the position of one or more surface features from the gap distances measured at the at least three radial distances from the axis of rotation.

10. The method of claim 9, which further comprises establishing a baseline gap distance by measuring the gap distance at a reference point.

11. The method of claim 10, which further comprises comparing the measured gap distance to the baseline gap distance and detecting an increase in the gap distance to identify a leading edge of the one or more recesses as the susceptor rotates.

12. The method of claim 11, which further comprises identifying the presence of a wafer in at least one of the one or more recesses by detecting a gap distance that is larger than the baseline gap distance, but less than the depth of the recess.

13. The method of claim 12, which further comprises determining whether the wafer is at least partially outside of a recess by detecting a gap distance that increases or decreases linearly as the susceptor rotates.

14. The method of claim 12, which further comprises storing the baseline gap distance and measured gap distances in a non-transient computer readable medium for subsequent calculations and statistical analysis; and
   determining whether the wafer is substantially coplanar with the recess by comparing the measured gap distance to an expected value when the wafer is substantially coplanar with the recess,
   wherein the one or more surface features include the positioning of a wafer in the recess.

15. The method of claim 12, which further comprises determining the eccentricity of a wafer position by measuring the lateral distance traversed by the susceptor between a leading edge of the recess and identifying the presence of a wafer in the recess.

16. The method of claim 9, wherein the rotation of the susceptor is intermittent, and the measuring of the gap distances between the operative face of a capacitive displacement sensor and the top surface of the susceptor is conducted when the susceptor is rotating.

17. The method of claim 9, which further comprises determining a tilt to the susceptor by simultaneously measuring the gap distance at three or more positions that form a triangular pattern.

* * * * *